United States Patent
Huynh (10) Patent No.: US 6,972,641 B2
(45) Date of Patent: Dec. 6, 2005

(54) FBAR LADDER FILTER AND METHOD OF GROUNDING OF FBAR LADDER FILTERS

(75) Inventor: Ngoc-Hoa Huynh, Forstinning (DE)

(73) Assignee: Infineon Technologies AG, Munich (DE)

( * ) Notice: Subject to any disclaimer, the term of this patent is extended or adjusted under 35 U.S.C. 154(b) by 39 days.

(21) Appl. No.: 10/776,855

(22) Filed: Feb. 11, 2004

(65) Prior Publication Data

US 2005/0134400 A1    Jun. 23, 2005

(30) Foreign Application Priority Data

Dec. 22, 2003  (EP) ................... 03029610

(51) Int. Cl.[7] ............................. H03H 9/72; H03H 9/64
(52) U.S. Cl. .................. 333/133; 333/189; 333/191; 333/92
(58) Field of Search ................. 333/186–192, 333/133

(56) References Cited

U.S. PATENT DOCUMENTS

| | | | |
|---|---|---|---|
| 6,262,637 B1 | 7/2001 | Bradley et al. | 333/133 |
| 6,291,931 B1 | 9/2001 | Lakin | 310/364 |
| 6,323,744 B1 | 11/2001 | Barber et al. | 333/189 |
| 6,472,954 B1 * | 10/2002 | Ruby et al. | 333/133 |
| 6,653,913 B2 * | 11/2003 | Klee et al. | 333/188 |
| 2001/0048352 A1 | 12/2001 | Klee et al. | 333/188 |
| 2002/0021192 A1 | 2/2002 | Klee et al. | 333/187 |
| 2003/0000058 A1 | 1/2003 | Tsai et al. | 29/25.35 |
| 2004/0085161 A1 * | 5/2004 | Kushitani et al. | 333/195 |
| 2004/0124952 A1 * | 7/2004 | Tikka | 333/189 |

FOREIGN PATENT DOCUMENTS

DE    101 27 655 A1    1/2003    ............ H03H 9/64

* cited by examiner

Primary Examiner—Barbara Summons
(74) Attorney, Agent, or Firm—Baker Botts L.L.P.

(57) ABSTRACT

A FBAR ladder filter which may yield less degradation in the stopband near the passband edges than conventionally grounded FBAR ladder filters. For that purpose a thin film resonator (FBAR) ladder filter having a plurality of serially-coupled FBAR elements, each serially-coupled FBAR element including an upper metal electrode and a lower metal electrode, and a plurality of shunt-coupled FBAR elements, each shunt-coupled FBAR element including an upper metal ground electrode providing a ground node and a lower metal electrode, is provided with at least one capacitor element including an upper metal electrode and a lower metal electrode, wherein each capacitor element is serially coupled between two ground nodes so that the inductive coupling of the shunt-coupled FBAR elements is compensated.

15 Claims, 5 Drawing Sheets

□ w/o capacitor element
— with capacitor element

FBAR LADDER FILTER AND METHOD OF GROUNDING OF FBAR LADDER FILTERS

PRIORITY

This application claims priority to European application no. EP03029610.7 filed Dec. 22, 2003.

TECHNICAL FIELD OF THE INVENTION

The present invention relates to grounding of thin film bulk acoustic wave resonator ladder filters. Some principles of grounding of such ladder filters are known for example from the U.S. Pat. No. 6,323,744.

DESCRIPTION OF THE RELATED ART

Figure 1:
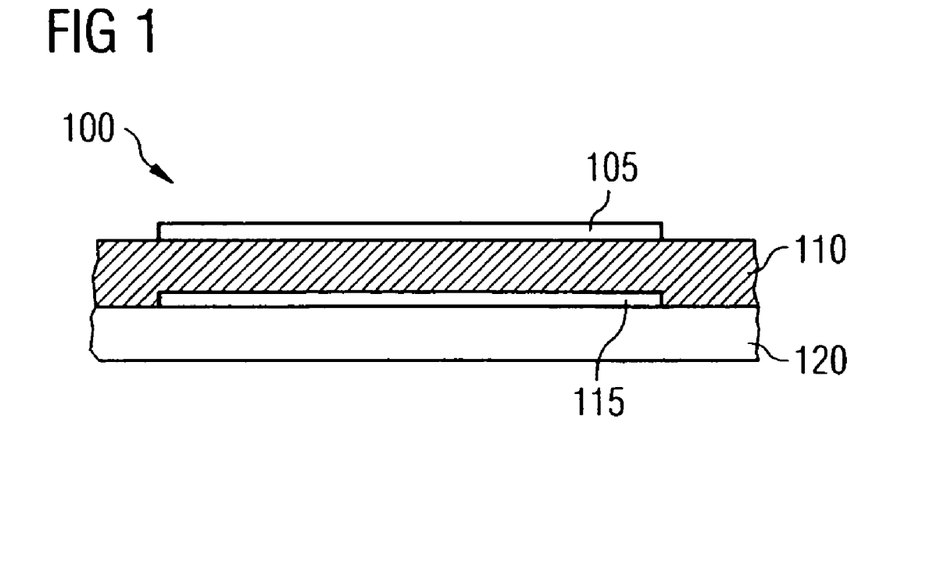
FIG. 1 is a side view of a conventional thin film resonator.

Thin film bulk acoustic wave resonators (hereinafter "FBAR") are typically used in high-frequency environments ranging from several hundred megahertz (MHz) to several gigahertz (GHz). FIG. 1 illustrates the general cross-section of a conventional FBAR component 100. In FIG. 1, FBAR component 100 includes a piezoelectric material 110 interposed between two conductive electrode layers 105 and 115, with electrode layer 115 which may be formed on a membrane or sets of reflecting layers deposited on a solidly mounted semiconductor substrate 120 which may be made of silicon or quartz, for example. The piezoelectric material is typically a dielectric, preferably one selected from the group comprising at least ZnO, CdS and AlN. Electrode layers 115 and 105 are formed from a conductive material, preferably of Al, Mo or W, but may be formed from other conductors as well or from composite layers of such conductors as disclosed in the U.S. Pat. No. 6,291,931 the content of which is incorporated hereby by reference.

These FBAR components are often used in electrical signal filters, more particularly in FBAR filters applicable to a lot of telecommunication technologies. For example, FBAR filters may be employed in cellular, wireless and fiber-optic communications, as well as in computer or computer-related information-exchange or information-sharing systems.

The desire to render these increasingly complicated information and communication systems portable and even handheld place significant demands on filtering technology, particularly in the context of increasingly crowded radio frequency resources. Therefore, FBAR filters must meet strict performance requirements which include:

(a) being extremely robust,
(b) being readily mass-produced and
(c) being able to sharply increase performance to size ratio achievable in a frequency range extending into the gigahertz region.

However, in addition to meeting these requirements, there is a need for low passband insertion loss simultaneously coupled with demand for a relatively large stopband attenuation. Moreover, some of the typical applications noted above for these FBAR filters require passband widths up to 4% of the center frequency, which is not easily achieved using common piezoelectrics such as AlN.

A standard approach to designing FBAR filters out of resonators is to arrange them in a ladder configuration alternately in a series-shunt relationship (i.e., a "shunt" resonator connected in shunt at a terminal of a "series" resonator), as disclosed for example in the US 6,262,637 the content of which is incorporated hereby by reference.

Figure 2:
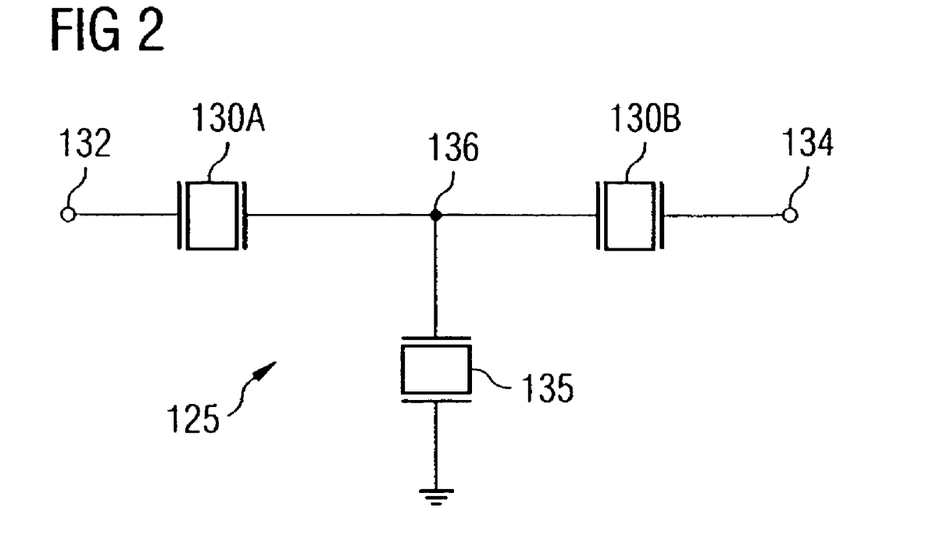
FIG. 2 illustrates a T-Cell block used in a conventional FBAR ladder filter.

Currently, the conventional way of designing FBAR ladder filters is to design simple building blocks of FBAR components which are then concatenated together (connected or linked up in a series or chain). FIG. 2 illustrates a simple building block in circuit form, commonly known as a T-Cell. Referring specifically to FIG. 2, a T-Cell 125 includes three FBAR components 130A, 130B and 135. FBARs 130A and 130B each are "series arm" portions of the T-Cell block. They are connected in series between an input port 132 and node 136, and node 136 to an output port 134 of T-Cell building block 125. Further, FBAR components 130A or 130B may be part of a series arm for an adjacently connected T-Cell, as will be discussed later. The resonator element 135 comprises the "shunt leg" portion of T-Cell building block 125, being connected in shunt between terminal 136 and ground. A plurality of these T-Cells 125 chained together form a FBAR ladder filter.

Figure 3A:
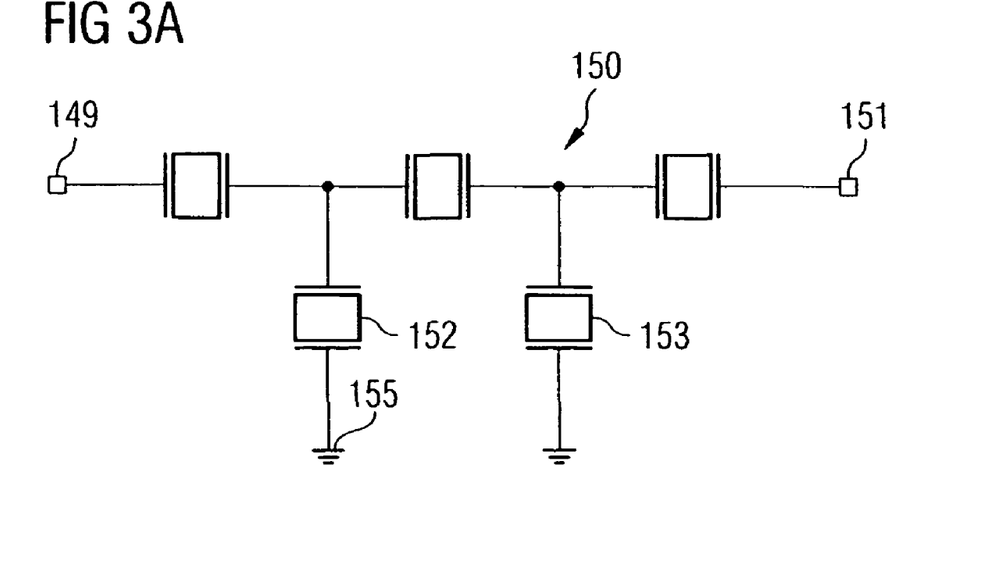
FIG. 3A illustrates a FBAR ladder filter circuit with an ideal grounding arrangement.
Figure 3B:
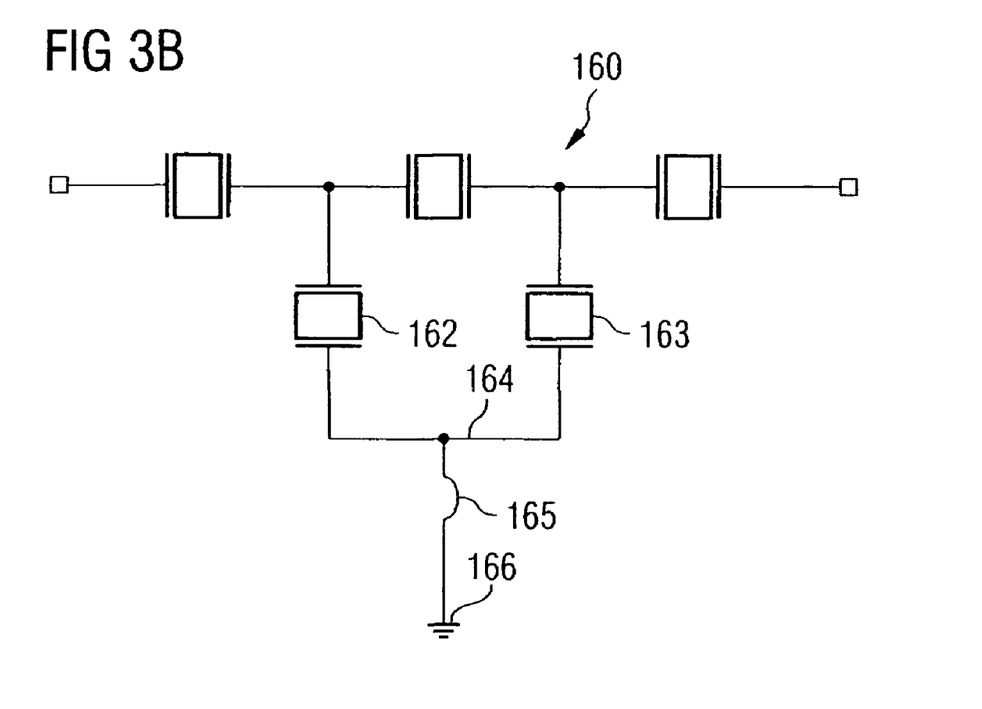
FIG. 3B illustrates a FBAR ladder filter circuit with a single wirebond grounding arrangement.

FIGS. 3A and 3B illustrate ideal and conventional grounding patterns for FBAR ladder filters. Ideally, FBAR ladder filters would like to see perfect isolated ground paths from each of its shunt legs to the final external ground of a package or carrier that the die rests on, so that there are no avenues of feedback or coupling between the shunt resonators. The die is an integral base on which the individual serially and shunt-coupled FBAR components of the ladder filter are fabricated on.

The die typically rests upon or is situated within a carrier or package. Such an ideal grounding arrangement is illustrated by the FBAR ladder filter circuit 150 shown between input port 149 and output port 151 of FIG. 3A. As shown in FIG. 3A, shunt FBAR elements 152 and 153 are directly grounded to the final external ground 155 of a carrier or package. Since all of the ground nodes of the ladder filter are top electrodes and are usually grouped next to each other, it is common practice to tie all the grounds together into one large ground pad, or "bus", and then wirebond this pad to the final package ground with one or more wirebonds. Such a grounding arrangement is illustrated in FIG. 3B.

In FIG. 3B, the die grounds of shunt elements 162 and 163 of FBAR ladder filter 160 are "tied" together to form a single metal strip 164 (i.e., a common die ground from the top metal electrodes) which is connected to the final external ground 166 on the carrier by wirebond 165. Although this provides somewhat adequate grounding, there is a significant degradation of the ladder filter performance in the stopband near the passband edges, due to the aforementioned coupling and/or feedback between the shunt resonators caused by this common die bus.

Figure 4A:
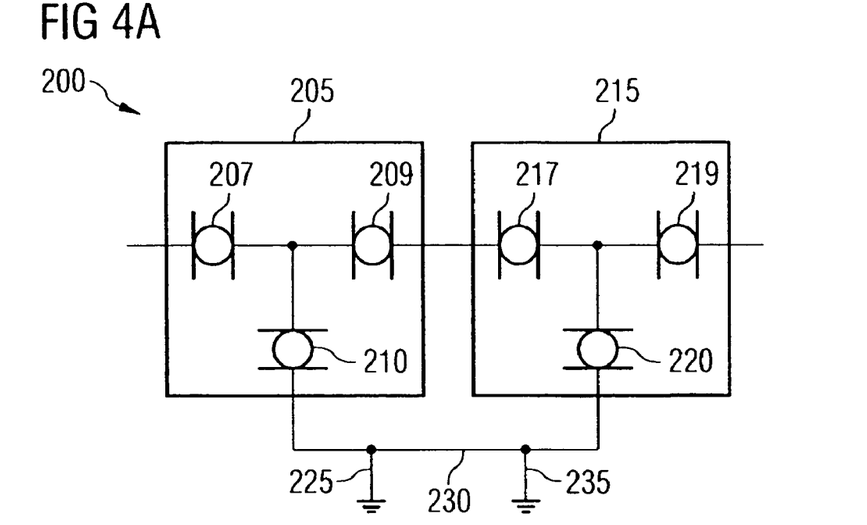
FIG. 4A illustrates a FBAR ladder filter circuit with a multiple wirebond grounding arrangement.
Figure 4B:
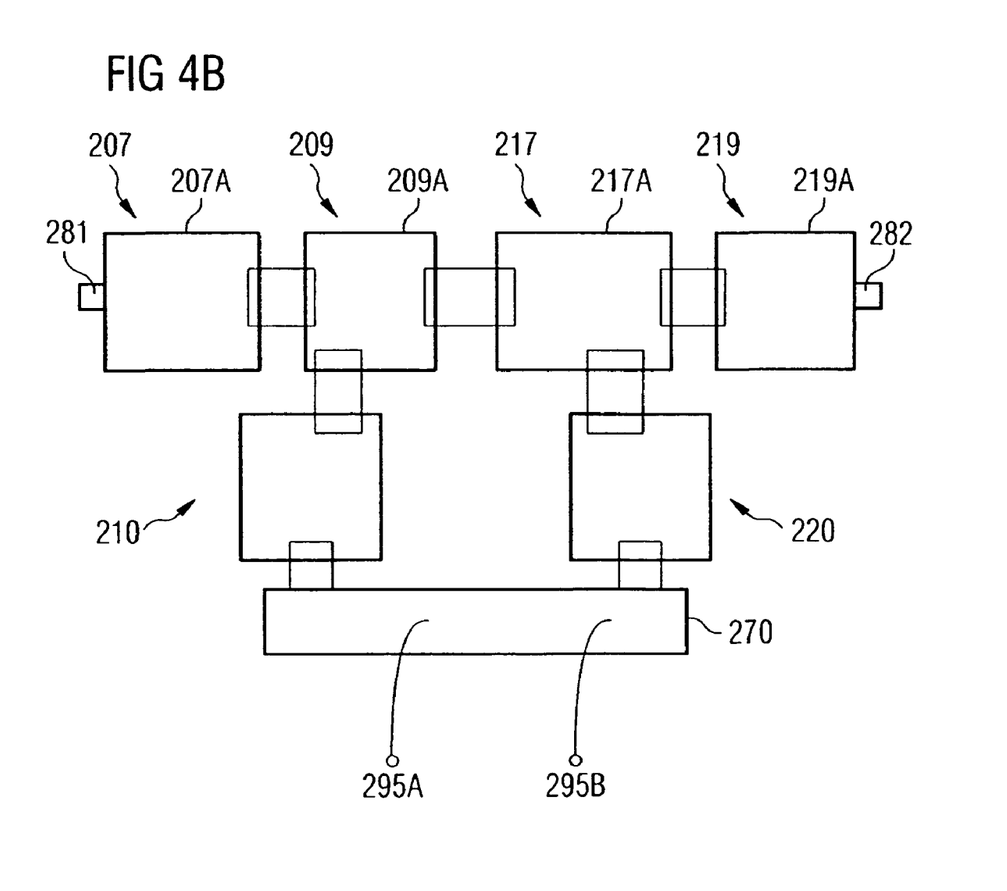
FIG. 4B is a physical representation of the FBAR ladder filter circuit of FIG. 4A.

These stopband performance "glitches" near the passband of a FBAR ladder filter can be somewhat minimized by adding multiple wirebonds. FIG. 4A illustrates a simplified view of a FBAR ladder filter circuit using multiple wirebonding, and FIG. 4B depicts a representation of the multiple wirebond arrangement of FIG. 4A. In FIG. 4A, the FBAR ladder filter 200 consists of two T-cells 205 and 215 concatenated together, T-cell 205 having serially-coupled FBAR elements 207 and 209 and shunt FBAR element 210, T-cell 215 having serially coupled FBAR elements 217 and 219 and shunt FBAR element 220. Similar to FIG. 3B, the grounds of the shunt FBAR elements 210 and 220 are tied together to form a single metal strip 230; however, instead of a single wirebond, two wirebonds 225 and 235 connect the common ground to the final external ground of the carrier or package (not shown).

FIG. 4B is a schematic view from the top of the FBAR ladder filter 200 of FIG. 4A. Specifically, in die 250 there is shown the arrangement of the top metal electrodes corresponding to the FBAR elements in T-cells 205 and 215 of FIG. 4A, as well as the wirebond connections to the final external ground.

Specifically, top electrodes 207A and 209A and 217A and 219B correspond to series FBAR elements 207, 209 and 217, 219 and metallization 270 is a common ground strip for connecting shunt FBAR elements 210 and 220 (analogous to the singular metal strip 230 connecting the shunt FBAR elements of the ladder filter 200) to an external ground (not shown). Connectors 281 and 282 connect the FBAR ladder filter to other components adjacent thereto within a particular system (not shown). Bottom electrodes (not shown) are common to respective FBAR elements in T-cells 205 and 215 respectively. As can be seen from FIG. 4B, two wirebonds 295A and 295B (corresponding to wirebonds 225 and 235 in FIG. 4A) are for connecting the common ground strip of the adjacent FBAR shunt elements to the final external ground on a carrier or package on that the die rests on (not shown).

The use of multiple wirebonds somewhat improves the stopband glitches near the passband edges of the FBAR ladder filter, as compared to using the single wirebond shown in FIG. 3B. This is because by increasing the number of wirebonds to a final external ground, the overall inductance and resistance is lowered, which in turn helps to isolate the common die bus from the final package ground. This somewhat limits the deteriorating effects due to the feedback/coupling phenomena. However, the improvement is still unacceptable when compared to the response achievable by employing an ideal grounding arrangement as illustrated in FIG. 3A. Accordingly, there is a need for a FBAR ladder filter having an amended grounding arrangement which yields to superior filter performance than the aforementioned standard grounding techniques.

SUMMARY OF THE INVENTION

The present invention provides a FBAR ladder filter which may yield less degradation in the stopband near the passband edges than conventionally grounded FBAR ladder filters. By forming a capacitor between at least two of the plurality of shunt-coupled FBAR elements of the ladder filter is achieved by forming a capacitor on the die of the ladder filter. Thus, all shunt-coupled FBAR elements are capacitively decoupled from one another, reducing the feedback/coupling effects prevalent in filters with common die grounds or split die grounds.

Preferably, the capacitor element is formed using the same materials that are deposited in steps for fabricating the array of the acoustic resonators. For example, the electrodes and the piezoelectric layer that are deposited to fabricate the FBAR elements may be utilized in the formation of the capacitor element.

This is preferably achieved without any additional process steps to the FBAR element fabrication. The tuning of the capacity of the capacitor element can be provided merely by properly adjusting the area of its upper and lower electrodes. Of course, the tuning of the capacitor element could be done also by adjusting the thickness of the piezoelectric layer. However, it is preferred to tune the capacity of the capacitor element by adjusting the area of its electrodes and thus providing an capacitor element having the same thickness as the FBAR elements on the die. It only has to be ensured that this additional "series resonator" element functions as a capacitor, especially as a decoupling capacitor, and not as a resonator. That means that the resonance frequency of that additional "series resonator" element has to be in a frequency range far away of the relevant ladder filter frequencies.

BRIEF DESCRIPTION OF THE DRAWINGS

The present invention will become fully understood from the detailed description given herein below and the accompanying drawings, wherein like elements represent like reference numerals, which are given by way of illustration only and thus are not limitative of the invention and wherein.

DETAILED DESCRIPTION OF THE PREFERRED EMBODIMENTS

An embodiment of the present invention is directed to a thin film resonator ladder filter which provides improved performance in the stopband near the passband edges by providing a capacitor element between the shunt-coupled FBAR element in the ladder filter, so that the inductive coupling of the shunt-coupled FBAR elements among each other is compensated. Stopband performance "glitches" near the passband are significantly reduced, as compared to the conventional single and multiple wirebond grounding arrangements currently used in grounding a FBAR ladder filter to the carrier or package on which it rests.

Figure 5A:
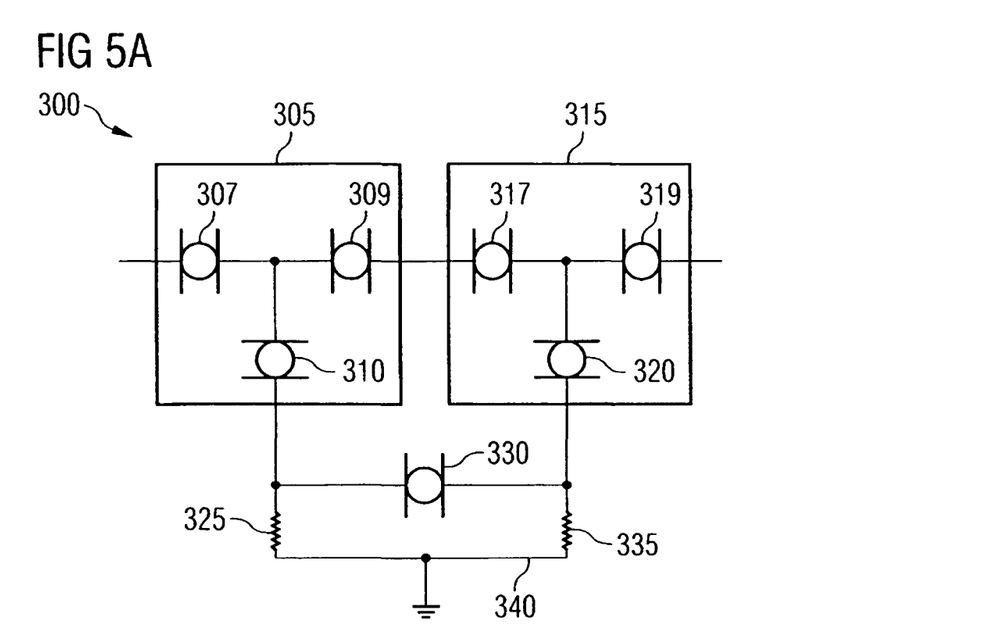
FIG. 5A illustrates a FBAR ladder filter circuit with a capacitor element between the shunt FBAR elements in accordance with the present invention.
Figure 5B:
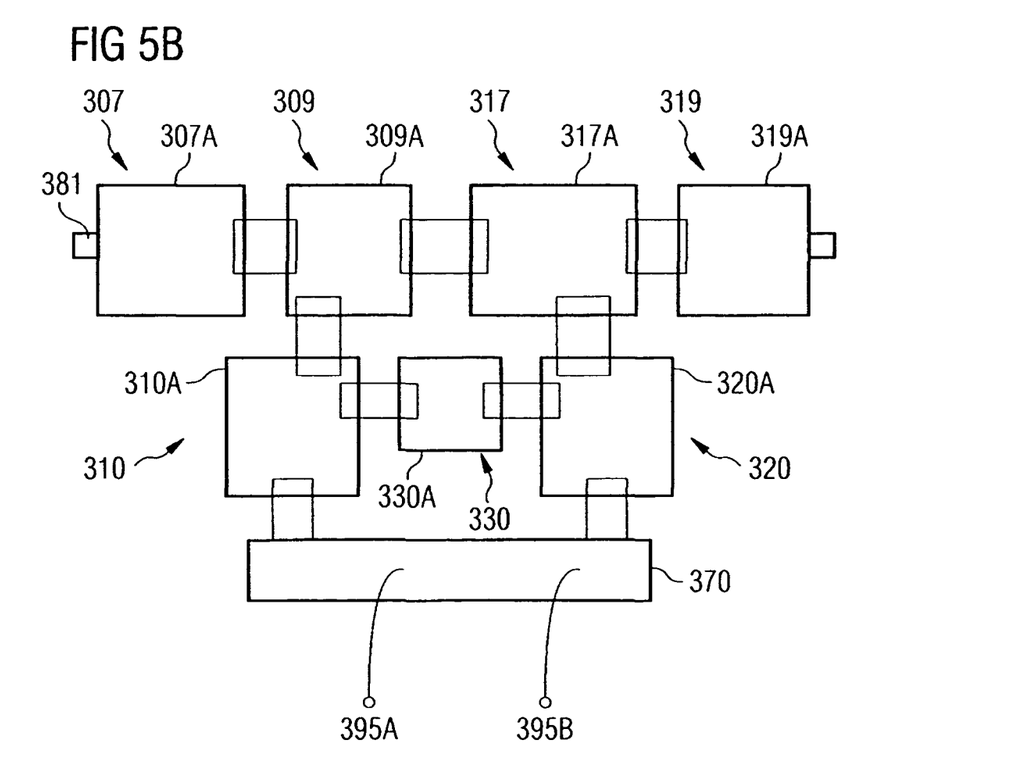
FIG. 5B is a schematic view from the top of the FBAR ladder filter circuit of FIG. 5A.

FIG. 5A illustrates a FBAR ladder filter circuit with a decoupling capacitor grounding arrangement in accordance with the present invention; and FIG. 5B is a schematic top view of the FBAR ladder filter circuit of FIG. 5A. The FBAR elements of FIGS. 5A and 5B are in respect to the FBAR elements almost identical to those previously identified in FIGS. 4A and 4B, so only those differences from the capacitor arrangement discussed in FIGS. 4A and 4B are emphasized.

In FIG. 5A, the FBAR ladder filter 300 consists of two T-cells 305 and 315 concatenated together, T-cell 305 having serially-coupled FBAR elements 307 and 309 and shunt FBAR element 310, T-cell 315 having serially coupled FBAR elements 317 and 319 and shunt FBAR element 320. Two wirebonds 325 and 335 connect the shunt FBAR elements 310 and 320 to the final external ground of the carrier or package 340. Additionally, a capacitor element 330 is serially connected between the two shunt FBAR elements 317 and 319.

As will be evident below, providing this capacitor element 330 between the two shunt-coupled FBAR element 317 and 319 in the FBAR ladder filter 300 enables the FBAR ladder filter 300 to better control parasitic stopband glitches near the passband, as compared to conventional single or multiple wirebonding from a single common die ground or from split die grounds to an external ground of a carrier or package.

FIG. 5B is a schematic view from the top of the FBAR ladder filter 300 of FIG. 5A. Specifically, in die 350 there is shown the arrangement of the top metal electrodes corresponding to the FBAR elements in T-cells 305 and 315 of FIG. 5A, as well as the wirebond connections to the final external ground.

Specifically, top electrodes 307A and 309A and 317A and 319B correspond to series FBAR elements 307, 309 and 317, 319 and the metallization 370 is a common ground strip for connecting the shunt FBAR elements 310 and 320 to an external ground (not shown).

Connectors 381 and 382 connect the FBAR ladder filter to other components adjacent thereto within a particular system (not shown). Bottom electrodes (not shown) are common to respective FBAR elements in T-cells 305 and 315 respectively. As can be seen from FIG. 5B, two wirebonds 395A and 395B (corresponding to wirebonds 325 and 335 in FIG. 5A) are for connecting the common ground strip of the adjacent FBAR shunt elements to the final external ground on a carrier or package on that the die rests on (not shown).

Between the two top ground electrodes 310A and 320A of the shunt FBAR elements 310 and 320 a capacitor element 330 is connected in series. The capacitor element 330 has an upper metal electrode 330A and a lower metal electrode (not shown). The lower metal electrode is connected with the upper ground metal electrode 310A of the shunt FBAR element 310 and the upper metal electrode 330A is connected with the upper ground metal electrode 320A of the shunt FBAR element 320. The capacitor element 330 is designed to act as a pure capacitor and not as a resonator. The capacitor element 330 is manufactured in the same way as the FBAR elements, i.e. the materials deposited are the same materials used for the FBAR elements.

Figure 7:
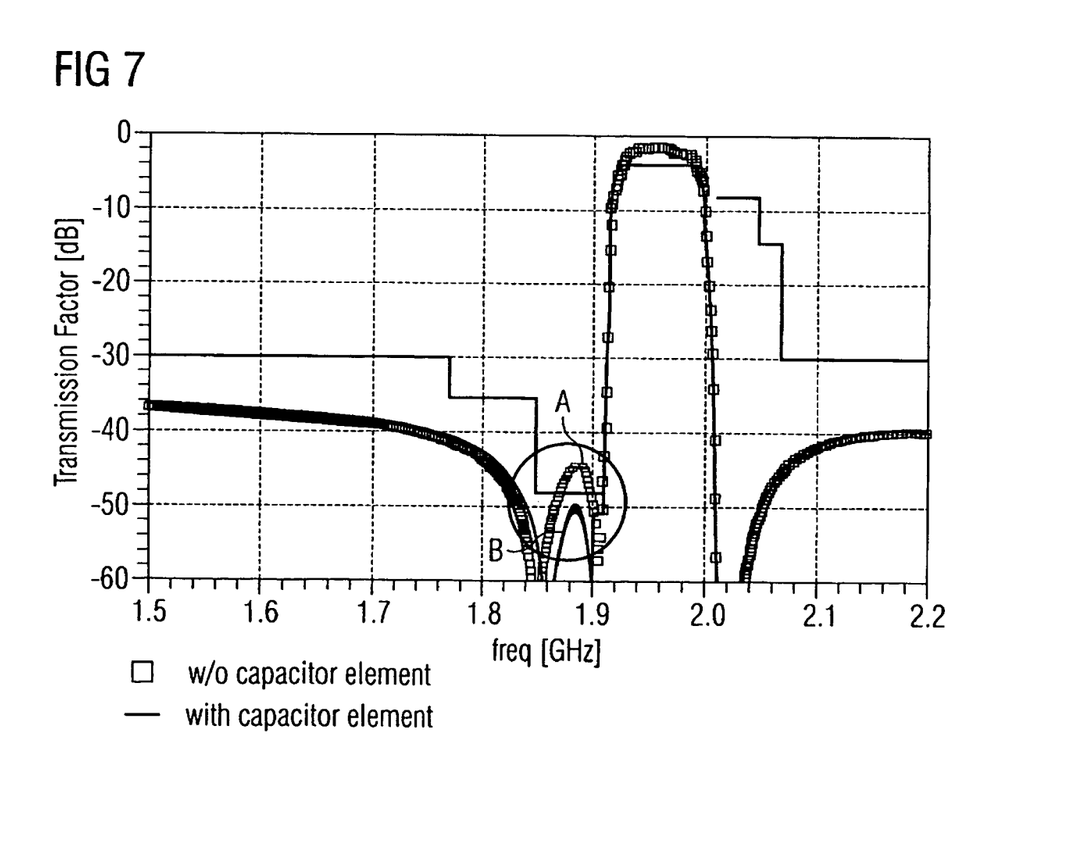
FIG. 7 illustrates the passband response characteristics for the FBAR filter circuit of the present invention of FIG. 5A and the grounding arrangements of FIG. 4A.

FIG. 7 illustrates a comparison of the passband response for the FBAR filter circuit of the embodiment with the grounding arrangements of FIGS. 4A and 5A. Specifically, FIG. 7 depicts the passband performance in dB (y-axis) vs. unit frequency (x-axis, 0.02 GHz/div.) for a FBAR filter circuit having: (a) a multiple-wirebond grounding from a common die ground (illustrated as "w/o capacitor" in the key of FIG. 7); and (b) a shunt resonator divided into separate elements, each having an individual shunt top ground electrode and a capacitor element connected in series between these two top ground electrodes, as illustrated in FIG. 5A (denoted as "with capacitor" in the key of FIG. 7).

The "shoulders" of each of the respective responses in FIG. 7 are labeled as A and B to denote the edges of the passband and to illustrate the distinction between the out-of-band rejection characteristics obtainable by the two different grounding arrangements. In the case where the FBAR filter is connected to the external ground in the conventional way, the out-of-band rejection characteristics is poor (see point "A" to the left of the passband).

However, in accordance with the present invention, the out-of-band response at the passband edges may be improved drastically over that attained with the conventional wirebonding arrangement of FIGS. 4A and 4B. This response is a response corresponding to the circuit structure of FIG. 5A, where a de-coupling capacitor element is connected in series between the two electrodes of the shunt resonators.

Therefore, the use of the FBAR ladder filter of the present invention allows especially for improved stopband response near the passband edge, as compared to conventional filters. The FBAR filter of the present invention reduces the disadvantageous effects of coupling/feedback by providing a capacitor element between the shunt legs of the ladder filter. Moreover, the grounding arrangement of the present invention more closely approximates the response attainable by perfect grounding than any conventional grounding arrangement. Further, the FBAR ladder filter grounding arrangement of the present invention is a perfect way for adjusting the conventional single and multiple-wirebond grounding arrangements from a common die ground, which are currently used to ground FBAR ladder filter circuits to a carrier or package.

Figure 6:
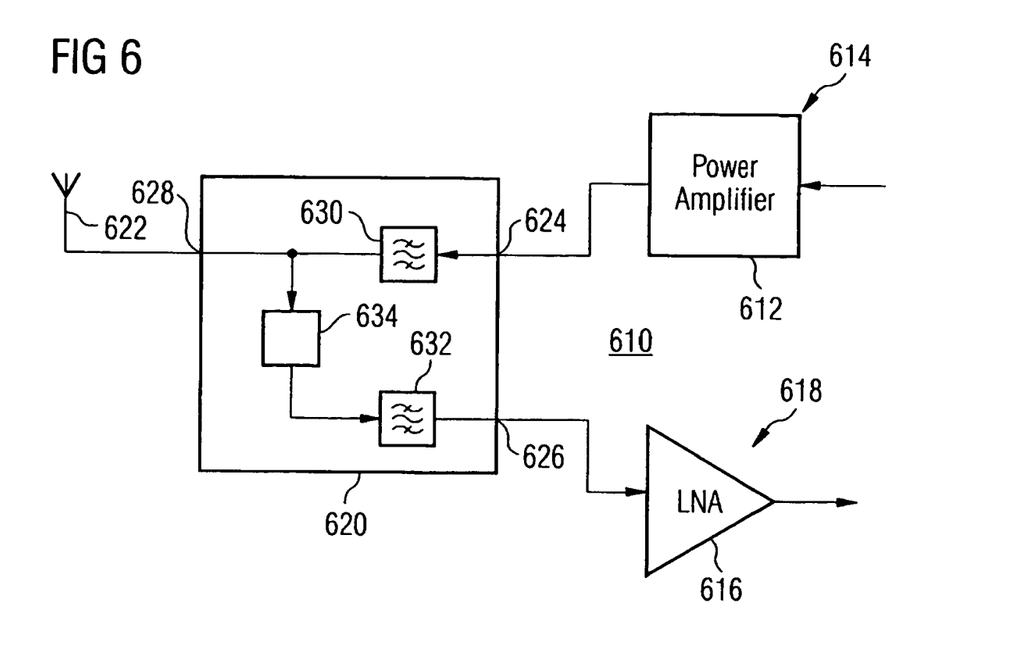
FIG. 6 is a block diagram showing the front-end circuit 60 of a conventional cellular telephone, personal communication system (PCS) device or other transmit/receive apparatus.

In a preferred embodiment of the present invention these ladder filters a incorporated in a duplexer, typically in a full duplexer, for telephony applications. To enable a full duplexer to be used, the transmit signal must be at a different frequency from the receive signal. The full duplexer lacks a switch and incorporates bandpass filters that isolate the transmit signal from the receive signal according to the frequencies of the signals. FIG. 6 shows a conventional front-end circuit 610 such as that used in a cellular telephone, personal communication system (PCS) device or other transmit/receive apparatus. In this, the output of the power amplifier 612 of the transmitter 614 and the input of the low-noise amplifier 616 of the receiver 618 are connected to the duplexer 620, which is a full duplexer. Also connected to the duplexer is the antenna 622.

The duplexer 620 is a three-port device having a transmit port 624, a receive port 626 and an antenna port 628. The antenna port is connected to the transmit port through the Tx bandpass filter 630 and to the receive port through the series arrangement of the 900 phase shifter 634 and Rx bandpass filter 632. The pass bands of the bandpass filters 630 and 632 are respectively centered on the frequency range of the transmit signal generated by the transmitter 614 and that of the receive signals to which the receiver 618 can be tuned. In the example shown, bandpass filters are configured such that the high-frequency stop band of the Tx bandpass filter 630 overlaps the pass-band of the Rx bandpass filter 632 and the low-frequency stop band of the Rx bandpass filter 632 overlaps the pass-band of the Tx bandpass filter 630.

The requirements for the bandpass filters 630 and 632 constituting the duplexer 620 are quite stringent, especially the requirements for the Rx bandpass filter 632 is very stringent. The bandpass filters isolate the very weak receive signal generated by the antenna 622 and fed to the input of the low-noise amplifier 616 from the strong transmit signal generated by the power amplifier 612. In a typical embodiment, the sensitivity of the low noise amplifier 616 is of the order of −100 dBm, and the power amplifier 612 can feed power levels of about 28 dBm into the duplexer. In such an example, the duplexer must attenuate the transmit signal by about 50 dB between the antenna port 628 and the receive port 626 to prevent the residual transmit signal mixed with the receive signal at the receive port from overloading the low-noise amplifier. Any feedback/coupling of the FBAR elements in the bandpass filters 630 and 632 has to be avoided since feedback/coupling would cause detrimental effects on the filter characteristics of the bandpass filters 630 and 632 and therefore on the performance of the whole duplexer.

The FBAR filters of the present invention also provide an ideal additional circuit element for connection to elements such as auxiliary inductors, auxiliary capacitors or variable capacitors. It is known that these components can be advantageously used to shape filter performance when added to input, output and/or shunt paths of the filter. If the conventional method of common die grounding is used, additional types of feedback/coupling between all shunt FBAR elements and further added additional circuit elements can be detrimental to the filter performance. However, in accordance with the filter arrangement of the present invention, desired circuit elements can be placed between the shunt top ground electrodes and its final ground, each desired circuit element capacitive decoupled from the rest of the shunt elements, thereby reducing the detrimental effects of feedback/coupling.

The invention being thus described, it will be obvious that the same may be varied in many ways. Although the T-cell structure is illustrated in designing a ladder filter, the grounding method may be used in filters designed by other methods that do not use the T-Cell as a building block. Such variations are not to be regarded as a departure from the spirit and scope of the invention, and also to modifications as would be obvious to one skilled in the art or intended to be included within the scope of the following claims.

What is claimed is:

1. A thin film resonator (FBAR) ladder filter, comprising:
    a plurality of serially-coupled FBAR elements provided in a die, each serially-coupled FBAR element including an upper metal electrode and a lower metal electrode;
    a plurality of shunt-coupled FBAR elements provided on said die, each shunt-coupled FBAR element including an upper metal ground electrode providing a ground node and a lower metal electrode, at least one capacitor element provided on said die, each capacitor element including an upper metal electrode and a lower metal electrode, wherein each capacitor element is serially coupled between two ground nodes so that the inductive coupling of the shunt-coupled FBAR elements is compensated.

2. The ladder filter of claim 1, wherein only one single capacitor element is provided on said die.

3. The ladder filter of claim 1, wherein said die rests on a carrier or package that includes an external ground.

4. The ladder filter of claim 3, wherein said final external ground is on a carrier or package upon which said die rests.

5. The ladder filter of claim 1, wherein said upper and lower electrodes of the at least one capacitor element are thin film metallic members made out of aluminum and/or molybdenum and/or tungsten.

6. The ladder filter of claim 1, wherein said upper and lower electrodes of the at least one capacitor element and said upper and lower electrodes of the series-coupled and shunt-coupled FBAR elements are thin film metallic members made out of the same metal or metal layers.

7. The ladder filter of claim 1, wherein said upper and lower electrodes of the at least one capacitor element having an active piezoelectric material interposed therebetween, said piezoelectric material selected from the group comprising at least ZnO, CdS and AlN.

8. The ladder filter of claim 1, said upper and lower electrodes of the at least one capacitor element and said upper and lower electrodes of the series-coupled and shunt-coupled FBAR elements having the same active piezoelectric material interposed therebetween.

9. The ladder filter of claim 1, wherein the capacity of the capacitor element necessary for compensating the inductive coupling is designed by primarily adjusting the area of the upper metal electrode and lower metal electrode.

10. A duplexer, comprising:
    a first port, a second port and a third port;
    a first bandpass filter connected between the first port and the third port, the first bandpass filter including a first ladder circuit having shunt and series FBAR elements; and
    a series circuit connected between the second port and the third port, the series circuit including a 90° phase shifter in series with a second bandpass filter, the second bandpass filter comprising a second ladder circuit having shunt and series FBAR elements, wherein at least one of the first and second ladder circuits comprises:
    a plurality of serially-coupled FBAR elements provided in a die, each serially-coupled FBAR element including an upper metal electrode and a lower metal electrode;
    a plurality of shunt-coupled FBAR elements provided on said die, each shunt-coupled FBAR element including an upper metal ground electrode providing a ground node and a lower metal electrode, at least one capacitor element provided on said die, each capacitor element including an upper metal electrode and a lower metal electrode, wherein each capacitor element is serially coupled between two ground nodes so that the inductive coupling of the shunt-coupled FBAR elements is compensated.

11. The duplexer of claim 10, wherein the first bandpass filter is a Tx filter and the second bandpass filter is a Rx filter.

12. The duplexer of claim 1 1, wherein the ladder circuit of the Rx filter comprises:
    a plurality of serially-coupled FBAR elements provided in a die, each serially-coupled FBAR element including an upper metal electrode and a lower metal electrode;
    a plurality of shunt-coupled FBAR elements provided on said die, each shunt-coupled FBAR element including an upper metal ground electrode providing a ground node and a lower metal electrode, at least one capacitor element provided on said die, each capacitor element including an upper metal electrode and a lower metal electrode, wherein each capacitor element is serially coupled between two ground nodes so that the inductive coupling of the shunt-coupled FBAR elements is compensated.

13. A method of grounding a ladder filter composed of a plurality of serially-coupled thin film resonator (FBAR) elements on a die, each pair of the plurality of serially-coupled FBAR elements having a FBAR element coupled in shunt therebetween, thus forming a plurality of adjacently shunt-coupled FBAR elements in the die, comprising:
    connecting between the upper grounding electrodes of at least two adjacently shunt-coupled FBAR elements a capacitor element; and
    connecting each adjacently shunt-coupled FBAR element to a final ground which is external to the ladder filter.

14. The method of claim 13, wherein said die rests on a carrier or package that includes said external ground.

15. A method of grounding a ladder filter, comprising:
    providing a plurality of serially-coupled thin film resonator (FBAR) elements on a die, wherein each serially-coupled FBAR element includes an upper and lower metal electrode;

providing a shunt FBAR element between pairs of said plurality of serially-coupled FBAR elements, thus forming a plurality of adjacently shunt-coupled FBAR elements in the die, wherein each adjacently shunt-coupled FBAR element includes an upper ground metal electrode and a lower metal electrode;

providing at least one capacitor element between pairs of said shunt-coupled FBAR elements, wherein each capacitor element is serially coupled between two upper grounding electrodes so that the inductive coupling of the shunt-coupled FBAR elements is compensated;

connecting each upper metal ground electrode of said adjacently shunt-coupled FBAR element to a final ground which is external to the ladder filter.

* * * * *